(12) United States Patent
Kozawa et al.

(10) Patent No.: US 7,646,036 B2
(45) Date of Patent: Jan. 12, 2010

(54) ELECTRODE AND GROUP III NITRIDE-BASED COMPOUND SEMICONDUCTOR LIGHT-EMITTING DEVICE HAVING THE ELECTRODE

(75) Inventors: Takahiro Kozawa, Aichi-Ken (JP); Kazuyoshi Tomita, Aichi-Ken (JP); Toshiya Uemura, Aichi-Ken (JP); Shigemi Horiuchi, Aichi-Ken (JP)

(73) Assignees: Kabushiki Kaisha Toyota Chuo Kenkyusho, Aichi-gun, Aichi-ken (JP); Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 12/068,247

(22) Filed: Feb. 4, 2008

(65) Prior Publication Data

US 2008/0185609 A1 Aug. 7, 2008

(30) Foreign Application Priority Data

Feb. 5, 2007 (JP) .............................. 2007-024969

(51) Int. Cl.
*H01L 33/00* (2006.01)
(52) U.S. Cl. .................... 257/99; 257/E33.064; 438/22
(58) Field of Classification Search .................. 257/99, 257/79, 615, 88; 438/104, 604, 605, 608

See application file for complete search history.

(56) References Cited

U.S. PATENT DOCUMENTS

| 6,794,690 | B2 | 9/2004 | Uemura | |
|---|---|---|---|---|
| 2006/0071226 | A1* | 4/2006 | Kojima et al. | ................. 257/98 |
| 2006/0104853 | A1* | 5/2006 | Tauchi et al. | ................. 420/501 |
| 2006/0214574 | A1* | 9/2006 | Kawaguchi et al. | ......... 313/506 |

FOREIGN PATENT DOCUMENTS

| JP | 11-220171 | 8/1999 |
|---|---|---|
| JP | 2003-168823 | 6/2003 |
| JP | 2006-41403 | 2/2006 |
| JP | 2006-245232 | 9/2006 |

* cited by examiner

*Primary Examiner*—Victor A Mandala
*Assistant Examiner*—Whitney Moore
(74) *Attorney, Agent, or Firm*—McGinn IP Law Group, PLLC

(57) ABSTRACT

An object of the invention is to prevent migration of silver contained in an electrode of a Group III nitride-based compound semiconductor light-emitting device. A positive electrode is formed on a p-type layer. In the positive electrode, an ITO light-transmitting electrode layer, a silver alloy reflecting electrode layer, a diffusion-preventing layer in which a Ti layer and a Pt layer are stacked, and a gold thick-film electrode are sequentially stacked on the p-type layer. The reflecting electrode layer made of a silver alloy contains palladium (Pd) and copper (Cu) as additives and also contains oxygen (O). By virtue of this structure, migration of silver from the silver alloy reflecting electrode layer and blackening of the interface between the silver alloy layer and the ITO light-transmitting electrode layer disposed thereunder are prevented, whereby light extraction efficiency can be enhanced.

20 Claims, 2 Drawing Sheets

[Fig. 1]
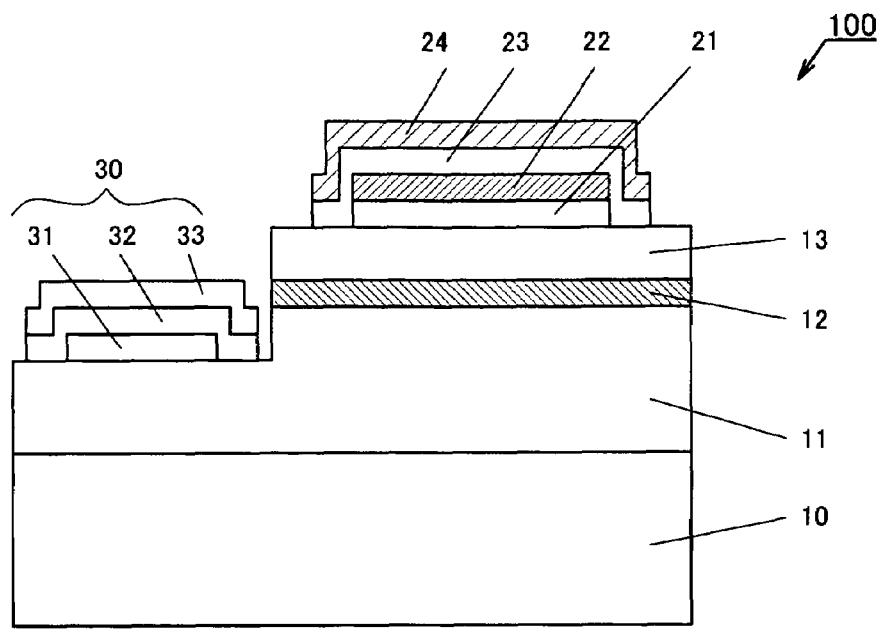
[Fig. 2]
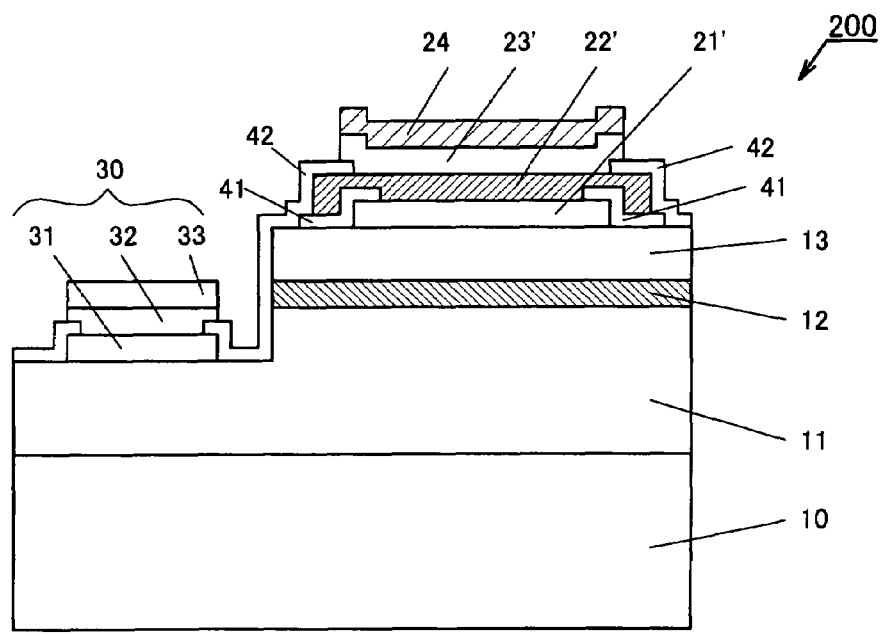

[Fig. 3]
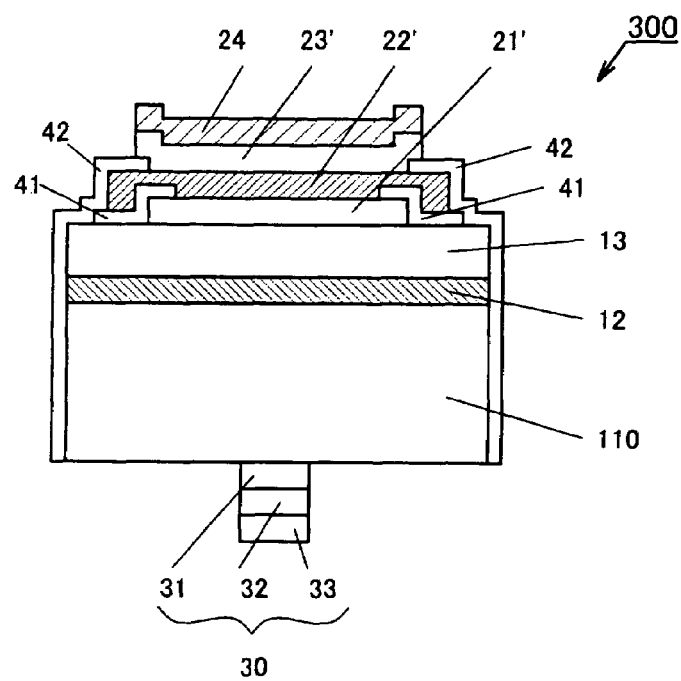
[Fig. 4]
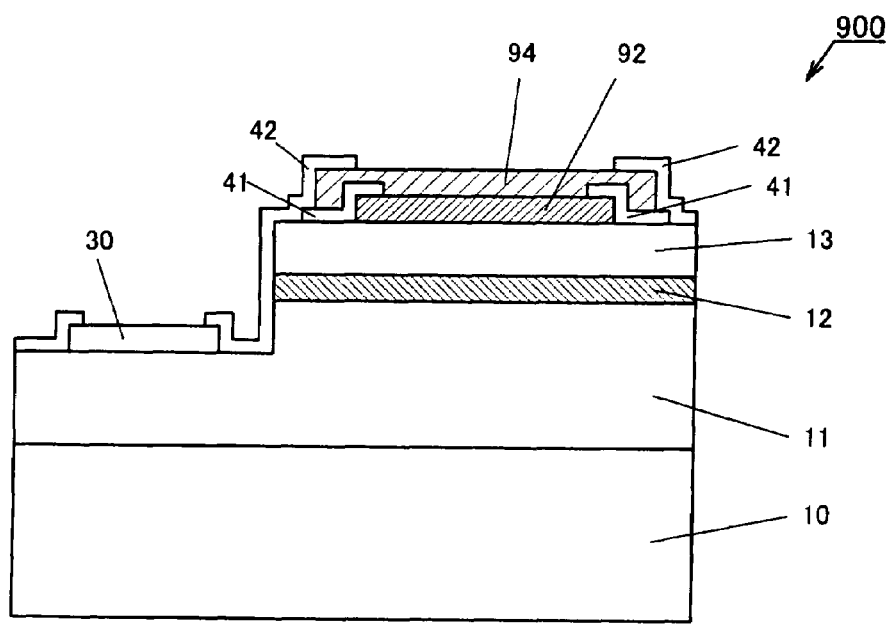
PRIOR ART

ELECTRODE AND GROUP III NITRIDE-BASED COMPOUND SEMICONDUCTOR LIGHT-EMITTING DEVICE HAVING THE ELECTRODE

BACKGROUND OF THE INVENTION

1. Field of the Invention

The present invention relates to a positive electrode of a Group III nitride-based compound semiconductor light-emitting device. The term "Group III nitride-based compound semiconductor" refers to a semiconductor represented by $Al_xGa_yIn_{1-x-y}N$ ($0 \leq x \leq 1$; $0 \leq y \leq 1$; and $0 \leq x+y \leq 1$) and the same species to which a predetermined additive for determining the conduction type (n- or p-) or for modifying other properties has been added. The Group III nitride-based compound semiconductor also encompasses these semiconductor species in which a Group III element has been partially substituted by B or Tl or a Group V element has been partially substituted by P, As, Sb, or Bi.

2. Background Art

FIG. 4 is a cross-section of a Group III nitride-based compound semiconductor light-emitting device 900. In the Group III nitride-based compound semiconductor light-emitting device 900, one or more n-type $Al_xGa_yIn_{1-x-y}N$ layers 11, a light-emitting layer (active layer) 12 having a single-layer, SQW, or MQW structure, and one or more p-type $Al_xGa_yIn_{1-x-y}N$ layers 13 are formed through, for example, epitaxial growth, on a dielectric substrate 10 such as a sapphire substrate via a buffer layer or a similar layer (not illustrated). After formation of these layers, the n-type $Al_xGa_yIn_{1-x-y}N$ layer 11 is exposed through etching or a similar technique, and an n-electrode 30 is formed on the exposed area. On the p-type $Al_xGa_yIn_{1-x-y}N$ layer 13, a reflecting electrode layer 92 formed from highly light-reflective silver or a silver-base alloy is provided so that the light-emitting device can be operated as a flip-chip-type light-emitting device employing the dielectric substrate 10 side as a light-extraction side. In order to prevent exfoliation of the periphery of the silver or silver alloy reflecting electrode layer 92, the periphery of the reflecting electrode layer 92 is partially covered with a first insulating layer 41 made of silicon oxide. The other portion of the reflecting electrode layer 92 is covered with a thick-film pad electrode layer 94 made of gold or a gold-base alloy. For preventing short circuit and other purposes, the periphery of the n-electrode 30 and that of the thick-film electrode layer 94 are covered with a second insulating layer 42 made of silicon oxide.

Such a technique is widely known in the art, and documents including Japanese Patent Application Laid-Open (kokai) Nos. 2006-41403 and 2006-245232 disclose the technique.

As has been known well, migration of silver ions from the silver electrode layer 92 occurs during passage of electricity. Migration of silver ions tends to occur in the direct formation of the silver electrode 92 on the Group III nitride-based compound semiconductor layer 13. Specifically, when the formed electrode 92 is thermally treated so as to enhance Ohmic contact with the Group III nitride-based compound semiconductor layer 13, the migration may occur. In addition, when silver comes into direct contact with the gold pad electrode 94, inter-diffusion between silver and gold tends to occur during passage of electricity or heating.

SUMMARY OF THE INVENTION

The present invention has been conceived in order to solve the aforementioned problems. Thus, an object of the invention is to prevent, when a silver-containing positive electrode is employed in a flip-chip-type Group III nitride-based compound semiconductor light-emitting device, migration of silver to the Group III nitride-based compound semiconductor and also migration of silver in the opposite direction to a pad electrode.

Accordingly, in a first aspect of the present invention for solving the problems, there is provided a positive electrode formed on a p-type Group III nitride-based compound semiconductor layer, the electrode comprising a light-transmitting electrode layer;

a reflecting electrode layer formed from silver or a silver-base alloy;

a conductive diffusion-preventing layer for preventing migration of silver to an upper layer with respect thereto; and a thick-film layer comprising at least one of gold and a gold-base alloy, wherein these layers are sequentially stacked, in the order given, on the p-type semiconductor layer.

A second aspect of the present invention is drawn to a specific embodiment of the electrode according to the first aspect, wherein the light-transmitting electrode layer comprises at least one selected from a group consisting of a metal oxide, a metal nitride, and a metal sulfide.

A third aspect of the present invention is drawn to a specific embodiment of the electrode according to the second aspect, wherein the light-transmitting electrode layer comprises indium tin oxide (ITO).

A fourth aspect of the present invention is drawn to a specific embodiment of the electrode according to any one of the first to third aspects, wherein the diffusion-preventing layer comprises at least one of high-melting-point metal and a metal nitride, or has a multi-layer structure including at least one layer comprising at least one of a high-melting-point metal and a metal nitride.

A fifth aspect of the present invention is drawn to a specific embodiment of the electrode according to the fourth aspect, wherein the diffusion-preventing layer comprises at least one selected from a group consisting of platinum (Pt), tungsten (W), titanium (Ti), rhodium (Rh), and titanium nitride ($TiN_x$).

A sixth aspect of the present invention is drawn to a specific embodiment of the electrode according to any one of the first to fifth aspects, wherein the reflecting electrode layer is formed from a silver alloy to which at least one species selected from among copper, molybdenum, and palladium has been added as an additive in an amount of 0.1 mole % to 10 mole %.

A seventh aspect of the present invention is drawn to a specific embodiment of the electrode according to any one of the first to sixth aspects, wherein the reflecting electrode layer is formed from a silver alloy to which oxygen has been added as an additive in an amount of 0.1 mole % to 10 mole %.

In an eighth aspect of the present invention, there is provided a Group III nitride-based compound semiconductor light-emitting device having a positive electrode as recited in any one of the first to seventh aspects.

According to the present invention, firstly, a light-transmitting electrode layer which exhibits excellent adhesion and Ohmic properties and which is made of light-transmitting ITO or a similar material is formed on a Group III nitride-based compound semiconductor layer. Subsequently, a silver layer or a silver alloy layer is formed on the light-transmitting electrode layer, and a conductive diffusion-preventing layer for preventing inter-diffusion of silver and gold is provided between the silver or silver alloy layer and a gold or gold alloy thick-film electrode layer serving as the uppermost layer. By virtue of this structure, migration or diffusion of silver to a Group III nitride-based compound semiconductor layer or to a gold or gold alloy thick-film electrode layer (i.e., pad electrode) can be prevented.

According to the present invention, since Ohmic contact between the Group III nitride-based compound semiconductor layer and the light-transmitting electrode layer formed from ITO or a similar material is ensured, no additional thermal treatment is required after formation of a silver-containing layer. Therefore, migration of silver to a Group III nitride-based compound semiconductor layer can be further prevented.

By virtue of the light-transmitting electrode layer and the silver reflecting electrode layer, a high-performance light-emitting device which realizes effective reflection and attains an improved light-extraction efficiency can be produced. Particularly when a silver layer is formed on an oxide transparent electrode layer, silver or a silver alloy may be blackened by oxygen contained in the oxide of the light-transmitting electrode layer. In this case, the oxide forming the light-transmitting electrode layer becomes oxygen-deficient, thereby reducing transparency of the layer. In addition, blackening of the silver or silver alloy layer results in an increase in light absorption and a decrease in light reflection. Therefore, the total light-extraction efficiency is lowered. Such blackening is caused by diffusion of oxygen from the light-transmitting electrode layer and growth of grains attributed to oxidation of silver. According to the present invention, oxygen is added at in an amount of 0.1 to 10 mole % to a silver or silver alloy layer during formation thereof, whereby such blackening is prevented. Thus, a drop in light-extraction efficiency can be suppressed.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 1 is a cross-section of a Group III nitride-based compound semiconductor light-emitting device 100 according to one embodiment of the present invention;

FIG. 2 is a cross-section of a Group III nitride-based compound semiconductor light-emitting device 200 according to another embodiment of the present invention;

FIG. 3 is a cross-section of a Group III nitride-based compound semiconductor light-emitting device 300 according to still another embodiment of the present invention; and FIG. 4 is a cross-section of a conventional Group III nitride-based compound semiconductor light-emitting device 900.

DETAILED DESCRIPTION OF PREFERRED EMBODIMENTS

Preferably, the silver alloy contains, in a total amount of 10 mole % or less, preferably 1 mole % or less, one or more elements selected from among palladium (Pd), copper (Cu), manganese (Mn), platinum (Pt), tungsten (W), titanium (Ti), rhodium (Rh), vanadium (V), molybdenum (Mo), niobium (Nb), and nickel (Ni). A silver alloy to which at least one species of the elements has been added can more effectively prevent migration, as compared with pure silver.

The silver or silver alloy layer preferably has a thickness of 10 nm to 2 μm. When the thickness is less than 10 nm, the light-reflecting electrode layer formed of the silver (alloy) layer exhibits poor performance, whereas when the thickness is in excess of 2 μm, an effect commensurate with an increase in thickness fails to be attained, merely resulting in an increase in production cost. Therefore, more preferably, the silver or silver alloy layer has a thickness of 50 nm to 1 μm, still more preferably 100 nm to 500 nm.

When a pure silver layer is provided, the layer is preferably formed through a vapor deposition technique. Alternatively, sputtering or a similar technique may also be employed. A silver alloy layer containing another metal element is preferably formed through sputtering by use of a target(s) of the corresponding alloy prepared in advance. When an oxygen-containing silver layer is provided, the layer is preferably formed through simultaneous sputtering of two sputtering targets, which are silver and a metal oxide.

When the light-transmitting electrode layer provided under the silver or silver alloy layer is formed from an oxide serving as a light-transmitting electrode material, the silver or silver alloy layer may be blackened at an interface between the layer and the oxide light-transmitting electrode layer. Thus, preferably, oxygen atoms are added to the silver or silver alloy layer so as to prevent blackening. For forming the oxygen-added layer, sputtering is performed by use of a silver target and a metal oxide target containing an additive metal, whereby oxygen atoms can be incorporated into the silver or silver alloy layer. By virtue of the oxygen atoms, release of oxygen atoms from the metal oxide light-transmitting electrode layer is prevented, whereby deterioration in transparency of the metal oxide light-transmitting electrode layer can be prevented. This effect is particularly remarkable when the light-transmitting electrode is an ITO electrode.

The light-transmitting electrode is preferably formed from a metal oxide semiconductor such as $In_2O_3$, ZnO, or $SnO_2$ to which a dopant of interest has been added. A typical example of the doped metal oxide is ITO. Other than these oxides, a sulfide semiconductor such as ZnS or a nitride semiconductor may also be employed. No particular limitation is imposed on the thickness of the light-transmitting electrode layer, but a thickness of 10 nm to 1 μm is preferred. When the thickness is less than 10 nm, the electrode layer does not sufficiently serve as a contact electrode, whereas when the thickness is 1 μm or more, an effect commensurate with an increase in thickness fails to be attained, merely resulting in an increase in production cost. Therefore, the light-transmitting electrode layer more preferably has a thickness of 20 nm to 500 nm, still more preferably 50 nm to 200 nm. No particular limitation is imposed on the method of forming the light-transmitting electrode layer, and any of known methods such as sputtering may be employed.

The diffusion-preventing layer is preferably formed of a layer of palladium (Pd), copper (Cu), manganese (Mn), platinum (Pt), tungsten (W), titanium (Ti), rhodium (Rh), vanadium (V), molybdenum (Mo), niobium (Nb), or nickel (Ni). In the diffusion-preventing layer, a plurality of layers of different metals may be stacked to form a multi-layer structure. Alternatively, the diffusion-preventing layer may be formed from titanium nitride ($TiN_x$), ITO, which may serve as a light-transmitting electrode, or other materials. When the diffusion-preventing layer has a single-layer structure, the thickness of the layer is preferably 50 nm to 2 μm. When the thickness is less than 50 nm, the layer may fail to attain a satisfactory diffusion prevention effect in the case where a thermal treatment or the like is carried out, whereas when the thickness is 2 μm or more, an effect commensurate with an increase in thickness fails to be attained, merely resulting in an increase in production cost. Therefore, the diffusion-preventing layer more preferably has a thickness of 100 nm to 1

μm, still more preferably 200 nm to 500 nm. When the diffusion-preventing layer has a multi-layer structure, at least the total thickness of the component layers preferably falls within the aforementioned range, and the thickest component layer preferably has a thickness falling within the aforementioned range. For example, in the case where a 300-nm-thickness intermediate layer is employed, the lower surface of the intermediate layer which is in contact with the silver or silver alloy reflecting electrode layer, or the upper surface of the intermediate layer which is in contact with the gold or gold alloy thick-film electrode layer, may have a thickness as thin as 5 to 20 nm. Thus, the thickness of a layer made of an expensive material or a rare material can be reduced, which is advantageous in terms of production cost. No particular limitation is imposed on the method of forming the diffusion-preventing layer, and each metal layer may be formed through any of known methods such as vapor deposition or sputtering. When the diffusion-preventing layer is formed from ITO or another compound, any of known methods may be employed.

Embodiment 1

FIG. 1 is a cross-section of a flip-chip-type Group III nitride-based compound semiconductor light-emitting device 100 according to the present invention. Similar to the Group III nitride-based compound semiconductor light-emitting device 900 shown in FIG. 4, one or more n-type $Al_xGa_yIn_{1-x-y}N$ layers 11, a light-emitting layer (active layer) 12 having a single-layer, SQW, or MQW structure, and one or more p-type $Al_xGa_yIn_{1-x-y}N$ layers 13 are formed through, for example, epitaxial growth, on a dielectric substrate 10 such as a sapphire substrate via a buffer layer or a similar layer (not illustrated). After formation of these layers, the n-type $Al_xGa_yIn_{1-x-y}N$ layer 11 is exposed through etching or a similar technique, and an n-electrode 30 including a vanadium (V) layer 31 (thickness: 15 nm), an aluminum (Al) layer 32 (thickness: 500 nm), and a gold (Au) layer 33 (thickness: 300 nm) is formed on the exposed area.

A positive electrode is formed on the p-type $Al_xGa_yIn_{1-x-y}N$ layer 13. In the positive electrode, an ITO light-transmitting electrode layer 21 (thickness: 100 nm), a silver alloy reflecting electrode layer 22 (thickness: 300 nm), a diffusion-preventing layer 23 in which a Ti layer (thickness: 10 nm) and a Pt layer (thickness: 300 nm) are stacked, and a gold thick-film electrode (pad electrode) 24 (thickness: 1 μm) are sequentially formed on the p-type layer. The reflecting electrode layer 22 made of a silver alloy contains palladium (Pd) and copper (Cu) in combination in a total amount of about 1 mole % or less and also contains oxygen (O). The diffusion-preventing layer 23 is formed such that the layer also covers the outer surface of the ITO light-transmitting electrode layer 21 and that of the silver alloy reflecting electrode layer 22. By virtue of this structure, migration of silver from the silver alloy reflecting electrode layer 22 and blackening of the interface between the layer 22 and the ITO light-transmitting electrode layer 21 disposed thereunder are prevented, whereby light extraction efficiency on the dielectric substrate 10 side can be enhanced.

Embodiment 2

FIG. 2 is a cross-section of a flip-chip-type Group III nitride-based compound semiconductor light-emitting device 200 according to the present invention. Similar to the Group III nitride-based compound semiconductor light-emitting device 100 shown in FIG. 1, an n-type $Al_xGa_yIn_{1-x-y}N$ layer 11, a light-emitting layer (active layer) 12, and a p-type $Al_xGa_yIn_{1-x-y}N$ layer 13 are formed through, for example, epitaxial growth, on a dielectric substrate 10. After formation of these layers, the n-type $Al_xGa_yIn_{1-x-y}N$ layer 11 is exposed through etching or a similar technique, and an n-electrode 30 including a vanadium (V) layer 31 (thickness: 15 nm), an aluminum (Al) layer 32 (thickness: 500 nm), and a gold (Au) layer 33 (thickness: 300 nm) is formed on the exposed area.

A positive electrode is formed on the p-type $Al_xGa_yIn_{1-x-y}N$ layer 13. In the positive electrode, a ZnO:Al light-transmitting electrode layer 21' (thickness: 100 nm), a silver alloy reflecting electrode layer 22' (thickness: 300 nm), a diffusion-preventing layer 23' in which a titanium (Ti) layer (thickness: 10 nm), a tungsten (W) layer (thickness: 20 nm), a titanium (Ti) layer (thickness: 10 nm), and a platinum (Pt) layer (thickness: 50 nm) are stacked, and a gold thick-film electrode (pad electrode) 24 (thickness: 1 μm) are sequentially formed on the p-type layer. The reflecting electrode layer 22' made of a silver alloy contains molybdenum (Mo) and copper (Cu) in combination in a total amount of about 1 mole % or less and also contains oxygen (O).

Notably, in the Group III nitride-based compound semiconductor light-emitting device 200 shown in FIG. 2, a first insulating layer 41 made of silicon oxide is formed so as to cover the periphery of the ZnO:Al light-transmitting electrode layer 21'. The silver alloy reflecting electrode layer 22' is formed so as to also cover a part of the first insulating layer 41, whereby a wide reflection area is ensured. Furthermore, a second insulating layer 42 made of silicon oxide is formed so as to cover the periphery of silver alloy reflecting electrode layer 22'. The second insulating layer 42 is formed so as to reach the n-electrode 30, whereby short circuit is prevented.

Similar to Embodiment 1, according to Embodiment 2, migration of silver from the silver alloy reflecting electrode layer 22' and blackening of the interface between the layer 22' and the ZnO:Al light-transmitting electrode layer 21' disposed thereunder are prevented, whereby light extraction efficiency on the dielectric substrate 10 side can be enhanced.

In addition, according to Embodiment 2, the area of the reflecting electrode layer 22' is adjusted to be greater than that of the light-transmitting electrode layer 21'. Thus, the light emitted from the light-emitting layer to the positive electrode is can be more effectively reflected to the dielectric substrate 10, whereby the light extraction efficiency can be further enhanced.

Embodiment 3

FIG. 3 is a cross-section of a Group III nitride-based compound semiconductor light-emitting device 300 according to the present invention. The light-emitting device 300 differs from the a Group III nitride-based compound semiconductor light-emitting device 200 shown in FIG. 2 in that a GaN conductive substrate 110 is employed, that an n-electrode 30 is provided so as to cover only a part of the back surface of the substrate, and that a second insulating layer 42 is provided so as to also cover the periphery of the substrate. The other members of the light-emitting device 300 are the same as employed in the Group III nitride-based compound semiconductor light-emitting device 200 shown in FIG. 2, and the same members are denoted by the same reference numerals. Similar to Embodiment 2, according to Embodiment 3, migration of silver from the silver alloy reflecting electrode layer 22' and blackening of the interface between the layer 22' and the ZnO:Al light-transmitting electrode layer 21' disposed thereunder are prevented, whereby light extraction efficiency on the n-electrode 30 side can be enhanced.

What is claimed is:

1. A positive electrode formed on a p-type Group III nitride-based compound semiconductor layer, the electrode comprising:
   a light-transmitting electrode layer comprising a metal oxide;
   a reflecting electrode layer comprising a silver-base alloy formed from a silver alloy to which oxygen has been added as an additive in an amount of 0.1 mol % to 10 mol %;
   a conductive diffusion-preventing layer for preventing migration of silver to an upper layer with respect thereto, the conductive diffusion-preventing layer comprising one of:
      at least one of a high-melting-point metal and a metal nitride; and
      a multi-layer structure including at least one layer comprising at least one of a high-melting-point metal and a metal nitride; and
   a thick-film layer comprising gold or a gold-base alloy, wherein these layers are sequentially stacked, in the order given, on the p-type semiconductor layer.

2. The electrode as described in claim 1, wherein the light-transmitting electrode layer comprises indium tin oxide (ITO).

3. The electrode as described in claim 2, wherein the diffusion-preventing layer comprises at least one selected from a group consisting of platinum (Pt), tungsten (W), titanium (Ti), rhodium (Rh), and titanium nitride ($TiN_x$).

4. The electrode as described in claim 3, wherein the reflecting electrode layer is formed from a silver alloy to which at least one species selected from among copper, molybdenum, and palladium has been added as an additive in an amount of 0.1 mole % to 10 mole %.

5. The electrode as described in claim 2, wherein the reflecting electrode layer is formed from a silver alloy to which at least one species selected from among copper, molybdenum, and palladium has been added as an additive in an amount of 0.1 mole % to 10 mole %.

6. The electrode as described in claim 1, wherein the diffusion-preventing layer comprises at least one selected from a group consisting of platinum (Pt), tungsten (W), titanium (Ti), rhodium (Rh), and titanium nitride ($TiN_x$).

7. The electrode as described in claim 6, wherein the reflecting electrode layer is formed from a silver alloy to which at least one species selected from among copper, molybdenum, and palladium has been added as an additive in an amount of 0.1 mole % to 10 mole %.

8. The electrode as described in claim 1, wherein the reflecting electrode layer is formed from a silver alloy to which at least one species selected from among copper, molybdenum, and palladium has been added as an additive in an amount of 0.1 mole % to 10 mole %.

9. A Group III nitride-based compound semiconductor light-emitting device comprising:
   a positive electrode as recited in claim 1.

10. The electrode as described in claim 1, wherein the conductive diffusion-preventing layer has a thickness in a range of 200 nm to 500 nm.

11. The electrode as described in claim 1, wherein the thick-film layer has a thickness in a range of 5 nm to 20 nm.

12. A positive electrode formed on a p-type Group III nitride-based compound semiconductor layer of a Group III nitride-based compound semiconductor light-emitting device, said positive electrode comprising:
   a light-transmitting electrode layer formed on said p-type Group III nitride-based compound semiconductor layer, said light-transmitting electrode layer comprising a metal oxide;
   a reflecting electrode layer formed on said light-transmitting electrode layer, said reflecting electrode layer comprising a silver alloy, said silver alloy comprising oxygen added in a range of 0.1 mol % to 10 mol %;
   a diffusion-preventing layer formed on said reflecting electrode layer, said diffusion- preventing layer comprising one of:
      at least one of a high-melting-point metal and metal nitride; and
      a multi-layer structure including at least one layer comprising at least one of a high-melting-point metal and a metal nitride; and
   a thick-film electrode formed on said diffusion-preventing layer, said thick-film comprising one of gold and a gold-based alloy,
   wherein said diffusion-preventing layer is formed between said reflecting electrode layer and said thick-film electrode.

13. The electrode as described in claim 12, wherein said diffusion-preventing layer and said light-transmitting electrode layer surround said reflecting electrode layer.

14. The electrode as described in claim 12, wherein said diffusion-preventing layer and said light-transmitting electrode layer physically isolate said reflecting electrode layer.

15. The electrode as described in claim 12, wherein said diffusion-preventing layer, said reflecting electrode layer, and said p-type Group III nitride-based compound semiconductor layer surround said light-transmitting electrode layer.

16. The electrode as described in claim 12, wherein said diffusion-preventing layer, said reflecting electrode layer, and said p-type Group III nitride-based compound semiconductor layer physically isolate said light-transmitting electrode layer.

17. The electrode as described in claim 12, wherein said reflecting electrode layer has a size that is larger than sizes of said diffusion-preventing layer, said thick-film electrode, and said light-transmitting electrode layer.

18. The electrode as described in claim 12, further comprising:
   a first insulating layer comprising silicon oxide formed on said light-transmitting electrode layer and said p-type Group III nitride-based compound semiconductor layer; and
   a second insulating layer comprising silicon oxide formed on said reflecting electrode layer, said first insulating layer, and said p-type Group III nitride-based compound semiconductor layer.

19. The electrode as described in claim 18, wherein said first insulating layer is surrounded by said reflecting electrode layer, said p-type Group III nitride-based compound semiconductor layer, and said second insulating layer.

20. The electrode as described in claim 18, wherein said reflecting electrode layer is surrounded by said first insulating layer, said second insulating layer, said light-transmitting electrode layer, and said diffusion-preventing layer.

* * * * *